United States Patent
Park et al.

(10) Patent No.: US 10,353,290 B2
(45) Date of Patent: Jul. 16, 2019

(54) PHOTORESIST COMPOSITION FOR EXTREME ULTRAVIOLET AND METHOD OF FORMING PHOTORESIST PATTERN USING THE SAME

(71) Applicant: Samsung Electronics Co., Ltd., Suwon-si (KR)

(72) Inventors: Cheol Hong Park, Seoul (KR); Chawon Koh, Yongin-si (KR); Hyunwoo Kim, Seongnam-si (KR); Sang-Yoon Woo, Gwangmyeong-si (KR); Hyejin Jeon, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/183,541

(22) Filed: Jun. 15, 2016

(65) Prior Publication Data

US 2017/0010531 A1     Jan. 12, 2017

(30) Foreign Application Priority Data

Jul. 7, 2015    (KR) ........................ 10-2015-0096724

(51) Int. Cl.
| | |
|---|---|
| *G03F 7/039* | (2006.01) |
| *G03F 7/20* | (2006.01) |
| *G03F 7/32* | (2006.01) |
| *H01L 21/027* | (2006.01) |
| *G03F 7/09* | (2006.01) |
| *G03F 7/004* | (2006.01) |

(Continued)

(52) U.S. Cl.
CPC ............ *G03F 7/039* (2013.01); *G03F 7/0046* (2013.01); *G03F 7/0382* (2013.01); *G03F 7/0392* (2013.01); *G03F 7/091* (2013.01); *G03F 7/094* (2013.01); *G03F 7/11* (2013.01); *G03F 7/2004* (2013.01); *G03F 7/2047* (2013.01); *G03F 7/322* (2013.01); *H01L 21/0274* (2013.01)

(58) Field of Classification Search
None
See application file for complete search history.

(56) References Cited

U.S. PATENT DOCUMENTS

| | | | |
|---|---|---|---|
| 6,638,683 B1 * | 10/2003 | Tan ........................ | G03F 7/039 430/270.1 |
| 6,767,687 B1 | 7/2004 | Kim et al. | |
| 7,459,260 B2 | 12/2008 | Chandhok et al. | |

(Continued)

FOREIGN PATENT DOCUMENTS

| | | | |
|---|---|---|---|
| JP | 2008-111103 | * | 5/2008 |
| JP | 2008-203452 | * | 9/2008 |

(Continued)

OTHER PUBLICATIONS

Machine translation of JP 2008-203452 (2008).*

(Continued)

*Primary Examiner* — Martin J Angebranndt
(74) *Attorney, Agent, or Firm* — Muir Patent Law, PLLC

(57) ABSTRACT

The disclosed embodiments provide a photoresist composition for extreme ultraviolet (EUV) and a method of forming a photoresist pattern using the same. The photoresist composition includes an out-of-band (OOB) absorbing material absorbing light of a wavelength of 100 nm to 300 nm.

12 Claims, 9 Drawing Sheets

(51) Int. Cl.
*G03F 7/038* (2006.01)
*G03F 7/11* (2006.01)

(56) References Cited

U.S. PATENT DOCUMENTS

| | | | |
|---|---|---|---|
| 7,951,524 B2 | 5/2011 | Allen et al. | |
| 8,841,058 B2 | 9/2014 | Chang | |
| 8,895,226 B2 | 11/2014 | Kim et al. | |
| 8,945,808 B2 | 2/2015 | David et al. | |
| 9,134,623 B2 | 9/2015 | Streefkerk et al. | |
| 2003/0099901 A1* | 5/2003 | Hatakeyama | G03F 7/0045 430/270.1 |
| 2005/0008864 A1 | 1/2005 | Ingen Schenau et al. | |
| 2007/0128547 A1* | 6/2007 | Mizutani | G03F 7/0392 430/281.1 |
| 2007/0172769 A1* | 7/2007 | Kanna | G03F 7/0046 430/311 |
| 2007/0207408 A1* | 9/2007 | Hatakeyama | C08F 222/20 430/270.1 |
| 2008/0118860 A1* | 5/2008 | Harada | C08F 24/00 430/270.1 |
| 2008/0124656 A1* | 5/2008 | Kobayashi | C07C 309/00 430/286.1 |
| 2008/0299487 A1* | 12/2008 | Chang | G03F 7/0046 430/270.1 |
| 2008/0311530 A1 | 12/2008 | Allen et al. | |
| 2009/0087786 A1* | 4/2009 | Hatakeyama | G03F 7/0035 430/285.1 |
| 2011/0207051 A1 | 8/2011 | Sanders et al. | |
| 2012/0220112 A1* | 8/2012 | Hatakeyama | G03F 7/085 438/514 |
| 2014/0065546 A1* | 3/2014 | Hatakeyama | G03F 7/0397 430/285.1 |
| 2015/0030983 A1 | 1/2015 | Hatakeyama et al. | |
| 2015/0037712 A1 | 2/2015 | Shih et al. | |
| 2015/0140484 A1* | 5/2015 | Takizawa | C08F 212/14 430/18 |
| 2015/0147701 A1 | 5/2015 | Kim et al. | |

FOREIGN PATENT DOCUMENTS

| | | | | |
|---|---|---|---|---|
| JP | 2010-175859 | * | 8/2010 | ............ G03F 7/004 |
| JP | 2014-174329 A | | 9/2014 | |
| JP | 2015-011169 A | | 1/2015 | |
| JP | 2015-102627 A | | 6/2015 | |
| KR | 10-2008-0006944 A | | 1/2008 | |
| KR | 10-2012-0049640 A | | 5/2012 | |
| KR | 10-2012-0065745 A | | 6/2012 | |
| KR | 10-2015-0059574 A | | 6/2015 | |

OTHER PUBLICATIONS

George et al,."out of band exposure characterization with the SEMAYTECH berkley 0.3 NA microfield exposure tool", Proc. SPIE vol. 7271 articles 72710X (12 pages) (2009).*

Machine trtanslatiuon of JP 2010-175859 (2010).*

* cited by examiner

US 10,353,290 B2

PHOTORESIST COMPOSITION FOR EXTREME ULTRAVIOLET AND METHOD OF FORMING PHOTORESIST PATTERN USING THE SAME

CROSS-REFERENCE TO RELATED APPLICATION

This U.S. non-provisional patent application claims priority under 35 U.S.C. § 119 to Korean Patent Application No. 10-2015-0096724, filed on Jul. 7, 2015, in the Korean Intellectual Property Office, the disclosure of which is hereby incorporated by reference in its entirety.

TECHNICAL FIELD

The disclosed embodiments relate to a photoresist composition and a method of forming a photoresist pattern using the same. More particularly, embodiments relate to a photoresist composition for extreme ultraviolet (EUV) and a method of forming a photoresist pattern using the same.

BACKGROUND

Semiconductor devices are widely used in an electronic industry because of their small sizes, multi-functional characteristics, and/or low manufacture costs. However, as semiconductor devices have been highly integrated with the development of the electronic industry, various problems have been caused. For example, because of the high integration density of a semiconductor device, widths and/or spaces of patterns in the semiconductor device have been reduced while heights and/or aspect ratios of the patterns have been increased. Thus, process distributions of deposition processes and/or etching processes of thin layers may become deteriorated to cause deterioration of reliability of semiconductor devices.

SUMMARY

Embodiments may provide a photoresist composition for extreme ultraviolet (EUV) which is suitable for manufacturing a highly integrated semiconductor device.

Embodiments may also provide a method of forming a photoresist pattern using the photoresist composition for EUV.

In one aspect, a photoresist composition for extreme ultraviolet (EUV) may include photoresist resin of 1 wt % to 10 wt %, a photo acid generator of 0.1 wt % to 3 wt %, an out-of-band (OOB) absorbing material of 0.1 wt % to 3 wt %, and a solvent. The OOB absorbing material may be removed by a development solution.

In another aspect, a method of forming a photoresist pattern may include applying a photoresist composition to a top surface of a substrate to form a photoresist layer, exposing the photoresist layer using extreme ultraviolet (EUV), and performing a development process on the exposed photoresist layer to form a photoresist pattern on the substrate. The photoresist composition may include photoresist resin of 1 wt % to 10 wt %, a photo acid generator of 0.1 wt % to 3 wt %, an out-of-band (OOB) absorbing material of 0.1 wt % to 3 wt %, and a solvent. The OOB absorbing material may be removed in the development process.

BRIEF DESCRIPTION OF THE DRAWINGS

The concepts will become more apparent in view of the attached drawings and accompanying detailed description.

FIGS. 4B and 4C are cross-sectional views taken along a line I-I' of

FIG. 4A to illustrate a method of forming a pattern structure according to an embodiment.

DETAILED DESCRIPTION OF THE EMBODIMENTS

Exemplary embodiments are described herein with reference to cross-sectional views and/or plan views that are idealized exemplary views. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1:
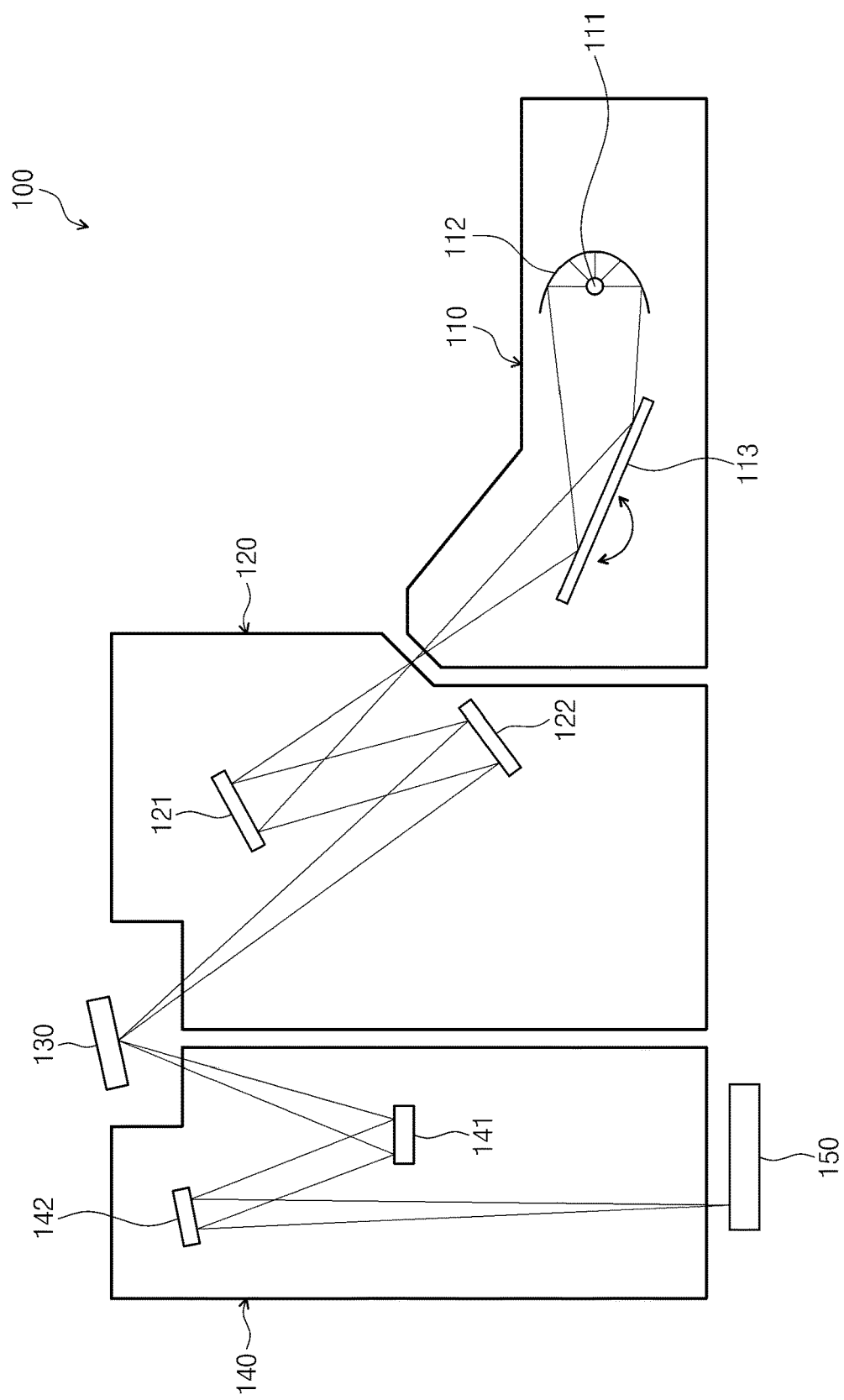
FIG. 1 is a schematic diagram illustrating an extreme ultraviolet (EUV) lithography apparatus according to an embodiment.

FIG. 1 is a schematic diagram illustrating an extreme ultraviolet (EUV) lithography apparatus according to an embodiment.

Referring to FIG. 1, an extreme ultraviolet (EUV) lithography apparatus 100 may include a beam shaping system 110, an illumination system 120, a photo mask 130, and a projection system 140. The beam shaping system 110, the illumination system 120, and the projection system 140 may be disposed in housings, respectively. In an embodiment, a portion or the whole of the beam shaping system 110 may be integrated with the illumination system 120.

The beam shaping system may include a light source 111, a collector 112, and a monochromator 113.

The light source 111 may be a laser plasma source, a gas-discharge source, or a synchrotron-based radiation source. Light (e.g., extreme ultraviolet (EUV)) generated from the light source 111 may have a wavelength ranging from about 5 nm to about 20 nm. The illumination system 120 and the projection system 140 may include components for EUV such that they 120 and 140 may be operated in the wavelength range of the light.

The EUV emitted from the light source 111 may be condensed by the collector 112, and the monochromator 113 may separate light having an undesired wavelength from the condensed EUV.

The EUV having the wavelength and a spatial distribution which are adjusted in the beam shaping system 110 may be introduced into the illumination system 120. In the embodiment of FIG. 1, the illumination system 120 may include two mirrors 121 and 122. However, embodiments are not limited to the number of the mirrors 121 and 122. In an embodiment, each of the mirrors 121 and 122 may have a multi-layered mirror structure.

The EUV may be provided to the photo mask 130 by the mirrors 121 and 122 of the illumination system 120. The photo mask 130 may have predetermined patterns (not shown). The EUV may be reflected by the patterns of the photo mask 120 so as to be projected on a substrate 150, to which a photoresist composition is applied, through the projection system 140. The photo mask 130 may include at least one reflective element.

The projection system 140 may project an image of the patterns of the photo mask 130 onto the substrate 150 having the photoresist composition by means of the EUV reflected from the photo mask 130. In the embodiment of FIG. 1, the projection system 140 may include two mirrors 141 and 142. However, embodiments are not limited to the number of the mirrors 141 and 142. In an embodiment, each of the mirrors 141 and 142 may have a multi-layered mirror structure.

In an embodiment, the EUV introduced to the substrate 150 having the photoresist composition may have a wavelength of 13.5 nm. However, lights of other wavelengths as well as the EUV of the wavelength of 13.5 nm may be provided to the substrate 150. A phenomenon that light having a wavelength except a desired wavelength is introduced to a substrate may be defined as "out-of-band (OOB)".

In the present embodiments, a layer selectively absorbing light of the out-of-band wavelength may be formed to provide the photoresist composition with improved resolution with respect to EUV. Hereinafter, the photoresist composition will be described.

Photoresist compositions may be generally classified into a positive-type resist and a negative-type resist. When an exposure process is performed on the positive-type resist, the solubility of an exposed portion of the positive-type resist may increase by a decomposition reaction and a molecular chain scission reaction. Thus, an unexposed portion of the positive-type resist may remain after a development process. When an exposure process is performed on the negative-type resist, the solubility of an exposed portion of the negative-type resist may be reduced by a cross-linking reaction. Thus, the exposed portion of the negative-type resist may remain after a development process. The photoresist composition according to the present embodiment may include a positive-type resist.

The photoresist composition according to an embodiment may include photoresist resin, a photo acid generator (PAG), a solvent, an OOB absorbing material, and an additive.

According to an embodiment, the photoresist composition may include the photoresist resin of about 1 wt % to about 10 wt %, the photo acid generator of about 0.1 wt % to about 3 wt %, the OOB absorbing material of about 0.1 wt % to about 3 wt %, the additive of about 0.1 wt % to about 1 wt %, and the solvent corresponding to the rest portion of the photoresist composition.

The photoresist resin may correspond to a main ingredient of a film or pattern.

Meanwhile, a KrF excimer laser light source, an ArF excimer laser light source, and/or a EUV light source may be used as a light source used in a photolithography technique. In the present embodiment, the photoresist composition may use the EUV light source, and a backbone of the photoresist resin of the photoresist composition may include at least one of photoresist resin for the KrF excimer laser light source, photoresist resin for the ArF excimer laser light source, or a hybrid thereof.

The photoresist resin for the KrF excimer laser light source may include a polyhydroxystyrene (PHS) type as expressed by the following chemical formula 1.

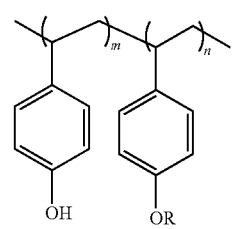

[Chemical formula 1]

In the chemical formula 1, "R" denotes a chain, branched or cyclic hydrocarbon group or hydroxyalkyl group having a carbon number of 1 to 10.

The photoresist resin for the ArF excimer laser light source may include a polyacrylate type as expressed by the following chemical formula 2.

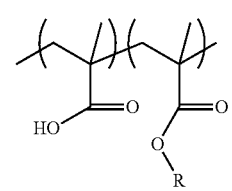

[Chemical formula 2]

In the chemical formula 2, "R" denotes a chain, branched or cyclic hydrocarbon group or hydroxyalkyl group having a carbon number of 1 to 10.

When the photo acid generator reacts with light, the photo acid generator may generate acid to change a solubility characteristic of the photoresist resin. The photo acid generator may include at least one selected from a group consisting of phthalimidotrifluoromethane sulfonate, dinitrobenzyltosylate, n-decyl disulfone, and naphthylimido trifluoromethane sulfonate. The photoresist resin may include at least one selected from a group consisting of diphenyl iodonium triflate, diphenyl iodonium nonaflate, diphenyl iodonium hexafluorophosphate, diphenyl iodonium hexafluoroarsenate, diphenyl iodonium hexafluoroantimonate, diphenyl p-methoxyphenyl sulfonium triflate, diphenyl p-toluenyl sulfonium triflate, diphenyl p-tert-butylphenyl sulfonium triflate, diphenyl p-isobutylphenyl sulfonium triflate, triphenylsulfonium triflate, tris(p-tert-butylphenyl) sulfonium triflate, diphenyl p-methoxyphenyl sulfonium nonaflate, diphenyl p-toluenyl sulfonium nonaflate, diphenyl p-tert-butylphenyl sulfonium nonaflate, diphenyl p-isobutylphenyl sulfonium nonaflate, triphenylsulfonium nonaflate, tris(p-tert-butylphenyl) sulfonium nonaflate, triphenylsulfonium hexafluoroarsenate, triphenylsulfonium hexafluoroantimonate, triphenylsulfonium triflate, and dibutylnaphthylsulfonium triflate.

The solvent may include at least one selected from a group consisting of ethyl cellosolve Acetate (ECA), ethyl lactate (EL), propylene glycol monomethyl ether acetate (PGMEA), N-butyl acetate (n-BA), 2-heptanone(MAK), methyl ethyl ketone (MEK), N,N-Dimethyl formamide (DMF), N-Methylpyrrolidone (NMP), ethyl 3-ethoxypropionate (EEP), methyl 3-methoxypropionate (MMP), ethyl pyruvate (EP), and isopropyl alcohol (IPA). The OOB absorbing material may be mixed in the photoresist composition. When the photoresist composition is applied to a top surface of an etch target layer by a coating process, the OOB absorbing material may be self-assembled from other ingredients of the photoresist composition to form a coating layer on an underlying layer formed of the other ingredients. The self-assembly characteristic may include a phase separation characteristic and a self-coating characteristic. The phase separation characteristic means that a phase of the OOB absorbing material is separated from a phase of the other ingredients, and the self-coating characteristic means that the OOB absorbing material is self-separated from the other ingredients to form a layer.

The OOB absorbing material may include a first material including fluorine and a second material absorbing light having a wavelength of about 100 nm to about 300 nm. According to an embodiment, the OOB absorbing material may include the first material of about 20 wt % to about 40 wt % and the second material of about 60 wt % to about 80 wt %.

The first material may include at least one of materials expressed by the following chemical formula 3.

[Chemical formula 3]

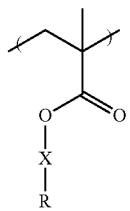

In the chemical formula 3, "X" denotes a chain, branched or cyclic hydrocarbon group, hydroxyalkyl group or alcohol group having a carbon number of 1 to 10.

In the present embodiment, the OOB absorbing material may include fluoro alcohol, and the fluoro alcohol may be self-assembled to be disposed on an underlying layer, formed of other ingredients, in the photoresist composition.

The first material including at least one of the materials expressed by the chemical formula 3 may react with a development solution (e.g., tetramethylammonium hydroxide (TMAH)) to have hydrophile property. In addition, the first material may also react with acid so as to be converted into —COOH after an exposure process, thereby having the hydrophile property. Thus, the OOB absorbing material may be changed to have the hydrophile property due to the first material. The OOB absorbing material changed to have the hydrophile property may be dissolved by a hydrophilic development solution. Thus, the OOB absorbing material layer (e.g., the coating layer) may be removed without an additional removal process.

For example, the first material may include at least one of materials expressed the following chemical formulas.

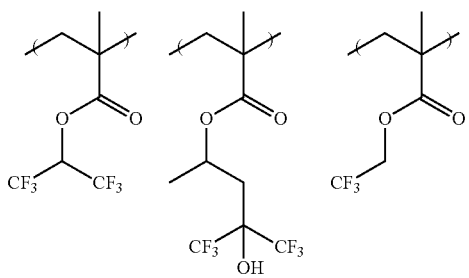

[Chemical formulas of examples of first material]

The second material may include at least one of materials expressed by the following chemical formulas 6 to 8.

[Chemical formula 6]

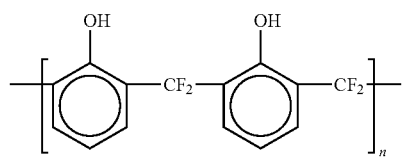

[Chemical formula 7]

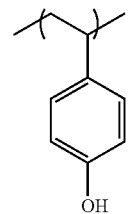

[Chemical formula 8]

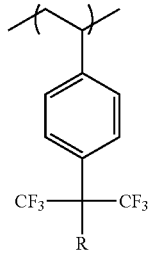

In the chemical formula 6, "n" denotes an integer equal to or greater than 1. In the chemical formula 8, "R" denotes a chain, branched or cyclic hydrocarbon group, hydroxyalkyl group or alcohol group having a carbon number of 1 to 10.

The second material including at least one of the materials expressed by the chemical formulas 6 to 8 may absorb the light having the wavelength of about 100 nm to about 300 nm. In particular, to increase an absorbance with respect to the light having the wavelength of about 100 nm to about 300 nm, the materials expressed by the chemical formulas 8 and 9 may include at least one of benzene, phenol, naphthalene, anthracene, or derivatives thereof Meanwhile, the material expressed by the chemical formula 6 is called 'novolac'. The second material may include a derivative of novolac.

Since the OOB absorbing material includes the first material dissolved by the development solution, an additional process of removing the OOB absorbing material may not be performed after formation of a photoresist pattern. In addition, the OOB absorbing material includes the second material absorbing the light having the wavelength of about 100 nm to about 300 nm, and thus, the light having the wavelength of about 100 nm to about 300 nm may be absorbed to the second material and may not be provided into a lower portion of the photoresist composition during an exposure process.

The additive may include an organic base (or a quencher). The organic base may minimize the influence of a basic compound (e.g., amine) included in the atmosphere upon a pattern formed after the exposure process and may control a shape of the pattern.

For example, the organic base may include at least one of triethylamine, triisobutylamine, triisooctylamine, triisodecylamine, diethanolamine, or triethanolamine.

In an embodiment, the additive may further include at least one of a surface active agent, a sensitizer, an adhesive, or a preservation stabilizer.

FIGS. 2A through 2D are cross-sectional views illustrating a method of forming a photoresist pattern according to an embodiment.

Figure 2A:
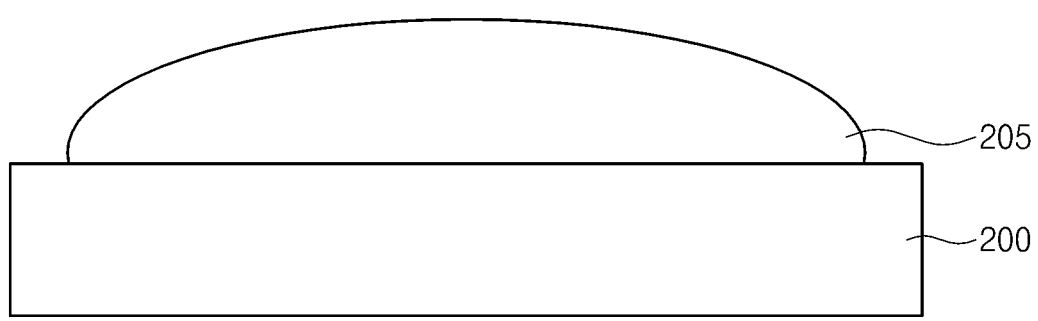
FIGS. 2A through 2D are cross-sectional views illustrating a method of forming a photoresist pattern according to an embodiment.
Figure 2B:
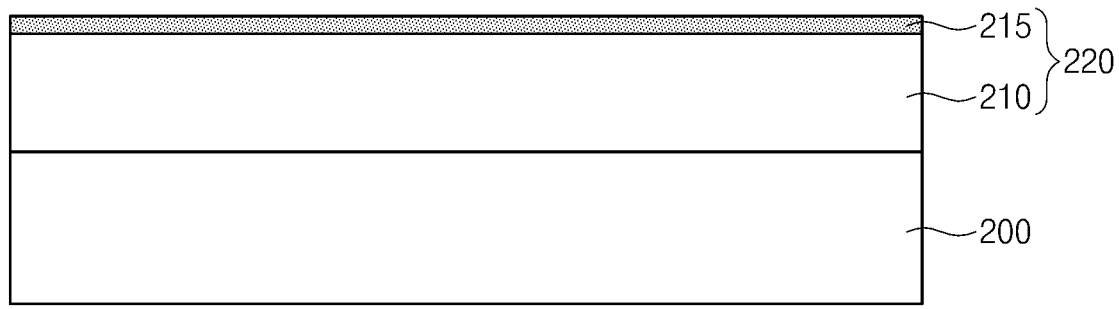

Referring to FIGS. 2A and 2B, a photoresist composition 205 may be applied to a top surface of a substrate 200 to form a photoresist layer 220. In an embodiment, the photoresist composition 205 may be applied to the substrate 200 by a coating process. The photoresist composition 205 may be the substantially same as described above, and thus, the description to the photoresist composition 205 will be omitted for the purpose of ease and convenience in explanation.

As illustrated in FIG. 2B, the photoresist composition 205 may be self-assembled to be divided into a lower photoresist layer 210 and an upper photoresist layer 215, simultaneously with the application of the photoresist composition 205. This is because the photoresist composition 205 includes the OOB absorbing material, as described above.

The upper photoresist layer 215 may absorb light having a wavelength of about 100 nm to about 300 nm and may selectively transmit light of an extreme ultraviolet (EUV) wavelength band.

In an embodiment, a soft bake process may be performed after applying the photoresist composition 205. The photoresist composition 205 may be in a liquid state after the applying process. During the soft bake process, the solvent of the photoresist composition 205 may be removed during the soft bake process, and thus, the photoresist composition 205 may be converted into a solid state. The soft bake process may be performed at a temperature of about 70 degrees Celsius to about 150 degrees Celsius.

Figure 2C:
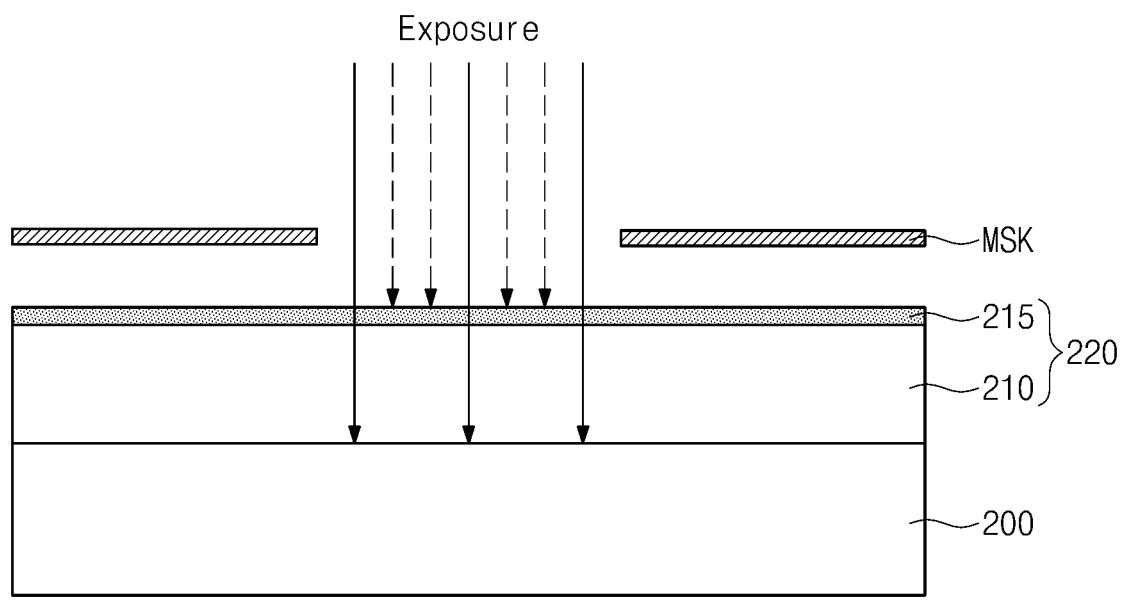

Referring to FIG. 2C, the photoresist layer 220 may be exposed using the lithography apparatus 100 (e.g., an exposure apparatus 100) described with reference to FIG. 1. Light transmitted through a photo mask MSK (i.e., the photo mask 130) of the exposure apparatus 100 may include light having the wavelength of about 100 nm to 300 nm and light of the EUV wavelength. The light having the wavelength of about 100 nm to 300 nm may be absorbed to the upper photoresist layer 215 and thus may not be provided to the lower photoresist layer 210, but the light of the EUV wavelength may penetrate the upper photoresist layer 215 so as to be selectively provided to the lower photoresist layer 210.

In an embodiment, a post-exposure bake (PEB) process may be performed after the exposure process. A chemical reaction may be amplified in the exposed photoresist layer 220 by the PEB process. The PEB process may be performed at a temperature of about 70 degrees Celsius to about 150 degrees Celsius.

Figure 2D:
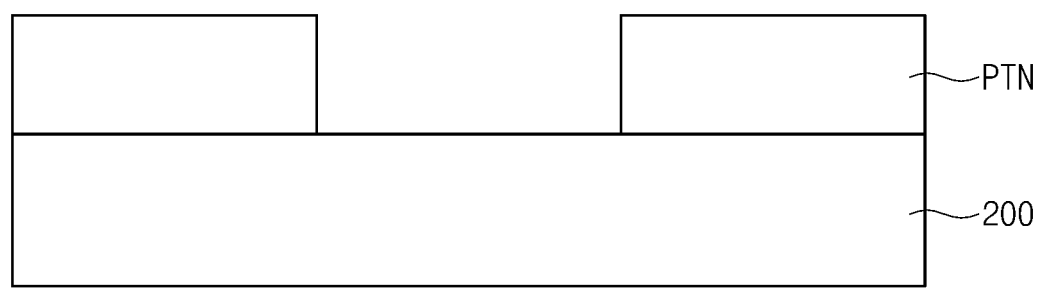

Referring to FIG. 2D, the exposed photoresist layer 220 may be developed using a development solution to form a photoresist pattern PTN. The development solution may include a water-solubility alkaline solution, e.g., TMAH. By the development process, an exposed portion of the photoresist layer 220 may be removed and the lower photoresist layer 210 of an unexposed portion of the photoresist layer 220 may remain to form the photoresist pattern PTN. At this time, all of exposed and unexposed portions of the upper photoresist layer 215 may be dissolved in the development solution during the development process so as to be completely removed.

In an embodiment, a hard bake process may be performed after the development process. The hard bake process may be performed at a temperature of about 70 degrees Celsius to about 170 degrees Celsius. Adhesive strength between the photoresist pattern PTN and the substrate 200 may increase by the hard bake process. In addition, the photoresist pattern PTN may have strong resistance by the hard bake process in a subsequent etching process or ion implantation process using the photoresist pattern PTN.

Figure 3A:
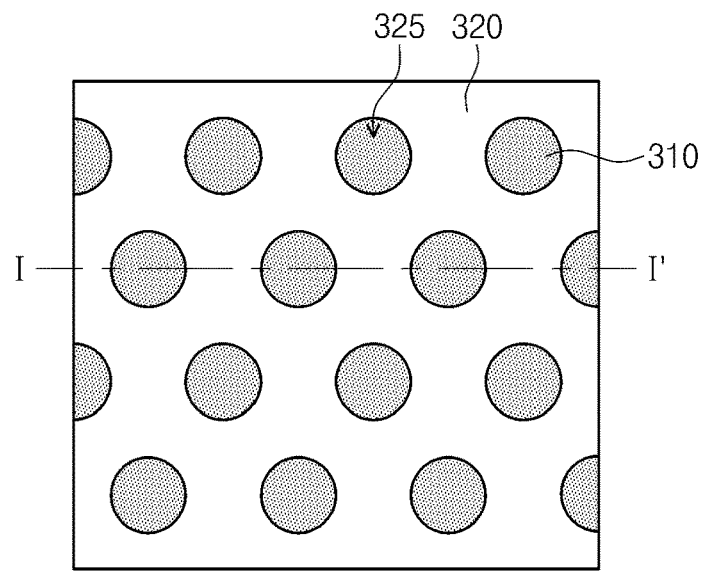
FIG. 3A is a plan view illustrating a method of forming a pattern structure according to an embodiment.
Figure 3B:
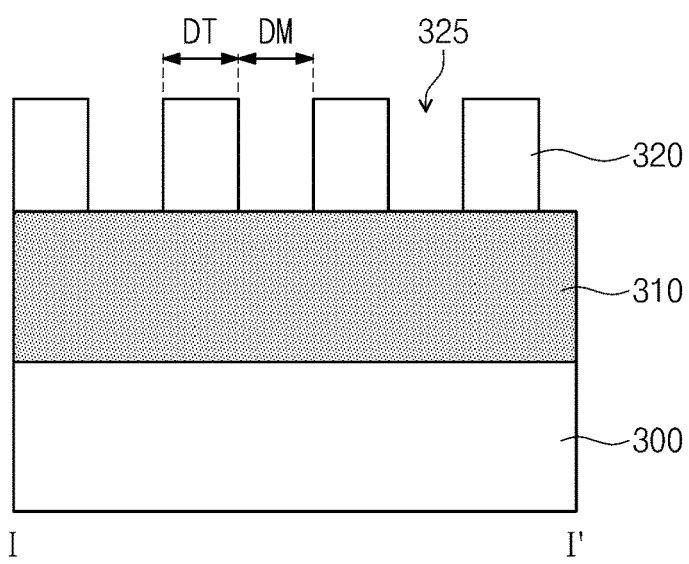
FIGS. 3B and 3C are cross-sectional views taken along a line I-I' of FIG. 3A to illustrate a method of forming a pattern structure according to an embodiment.
Figure 3C:
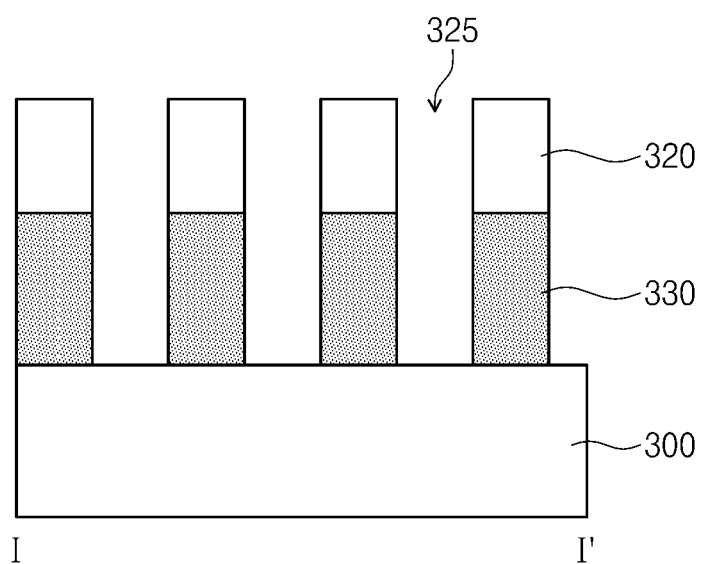

FIG. 3A is a plan view illustrating a method of forming a pattern structure according to an embodiment. FIGS. 3B and 3C are cross-sectional views taken along a line I-I' of FIG. 3A to illustrate a method of forming a pattern structure according to an embodiment.

Referring to FIGS. 3A and 3B, an etch target layer 310 and a photoresist pattern 320 may be formed on a substrate 300.

The substrate 300 may be a semiconductor substrate including silicon, germanium or silicon-germanium, a silicon-on-insulator (SOI) substrate, or a germanium-on-insulator (GOI) substrate.

The etch target layer 310 may include an insulating material (e.g., silicon oxide, silicon nitride, or silicon oxynitride), silicon doped with dopants, and/or a conductive material (e.g., a metal and/or a metal compound). Alternatively, the etch target layer 310 may not be formed, and at least a portion of the substrate 300 may be used as the etch target layer.

According to the present embodiment, the photoresist pattern 320 may have a plurality of holes 325. Each of the holes 325 may have a predetermined diameter DM, and a distance DT between the holes 325 adjacent to each other may be substantially equal to the predetermined diameter DM.

The photoresist pattern 320 may be formed by the processes described with reference to FIGS. 1 and 2A to 2D. In the present embodiment, the photoresist pattern 320 may be formed using the EUV lithography apparatus 100, and the wavelength of the light used in the EUV lithography apparatus 100 may be about 13.5 nm. Thus, each of the diameter DM and the distance DT of the holes 325 may be about 40 nm or less. In particular, each of the diameter DM and the distance DT of the holes 325 may be about 10 nm or less.

Referring to FIG. 3C, the etch target layer 310 may be etched using the photoresist pattern 320 as an etch mask to form a pattern structure 330 having a plurality of holes formed under the holes 325 of the photoresist pattern 320.

Figure 4A:
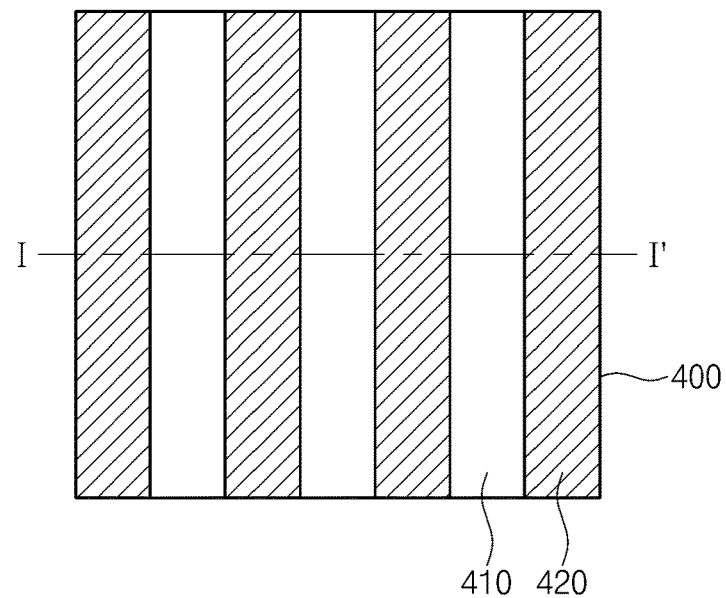
FIG. 4A is a plan view illustrating a method of forming a pattern structure according to an embodiment.
Figure 4B:
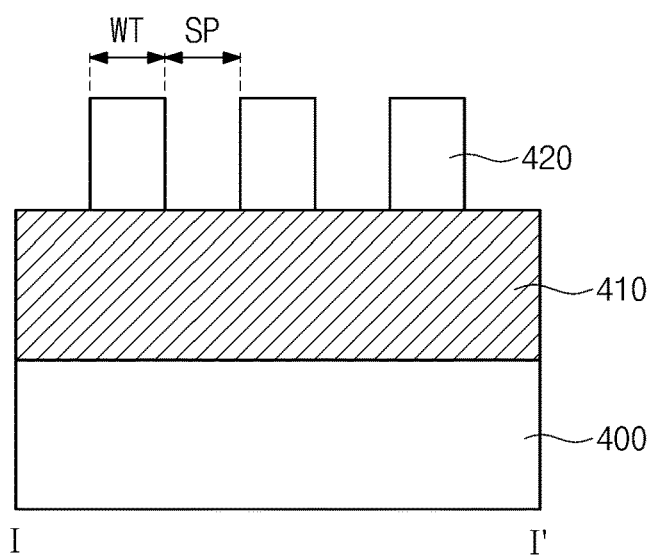
Figure 4C:
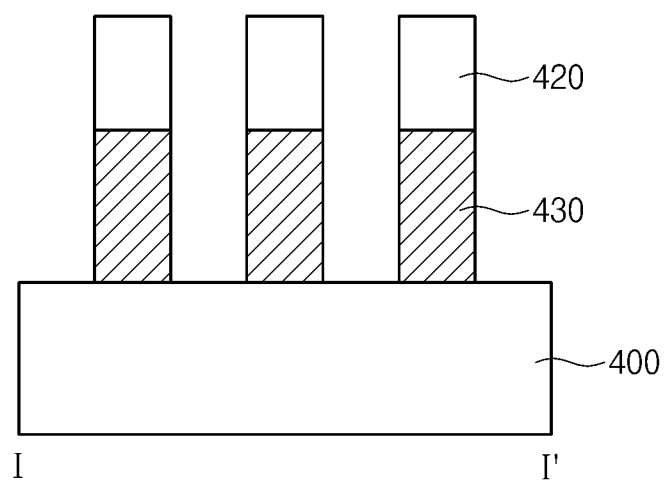

FIG. 4A is a plan view illustrating a method of forming a pattern structure according to an embodiment. FIGS. 4B and 4C are cross-sectional views taken along a line I-I' of FIG. 4A to illustrate a method of forming a pattern structure according to an embodiment.

Referring to FIGS. 4A and 4B, an etch target layer 410 and photoresist patterns 420 may be formed on a substrate 400.

According to the present embodiment, the photoresist patterns 420 may extend in one direction and may be spaced apart from each other at equal distances. In other words, the photoresist patterns 420 may have a line-and-space structure. Each of the photoresist patterns 420 may have a predetermined width WT, and a distance SP between the photoresist patterns 420 adjacent to each other may be substantially equal to the predetermined width WT.

The photoresist patterns 420 may be formed by the processes described with reference to FIGS. 1 and 2A through 2D. In the present embodiment, the photoresist patterns 420 may be formed using the EUV lithography apparatus 100, and the wavelength of the light used in the EUV lithography apparatus 100 may be about 13.5 nm. Thus, each of the width WT and the distance SP of the photoresist patterns 420 may be about 40 nm or less. In particular, each of the width WT and the distance SP of the photoresist patterns 420 may be about 10 nm or less.

Referring to FIG. 4C, the etch target layer 410 may be etched using the photoresist patterns 420 as an etch mask to form a pattern structure 430 having a line-and-space structure.

Figure 5:
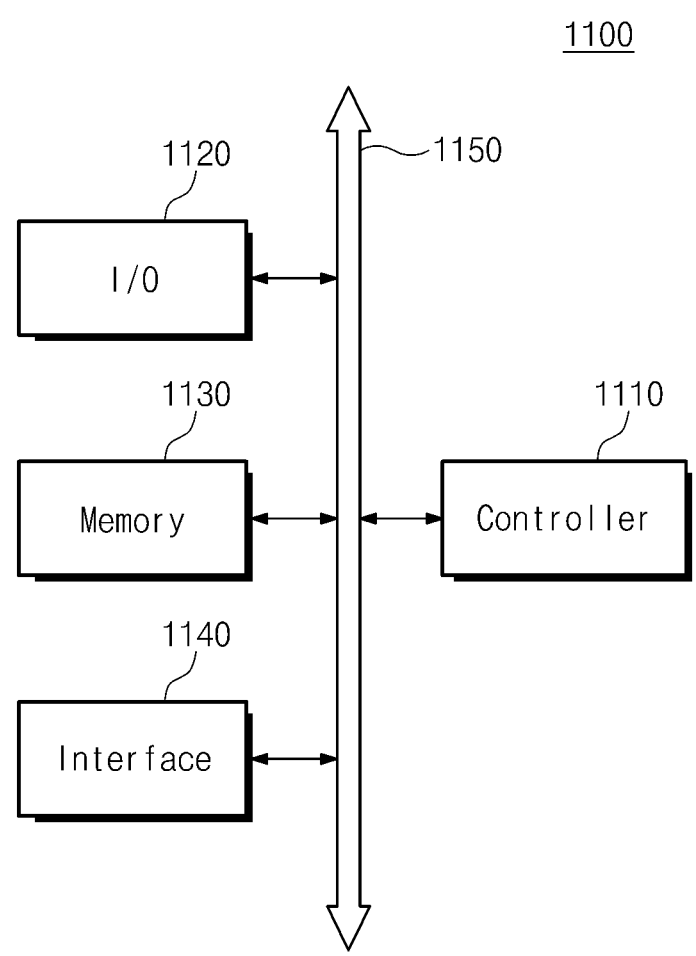
FIG. 5 is a schematic block diagram illustrating an embodiment of an electronic system including a semiconductor device manufactured according to embodiments.

FIG. 5 is a schematic block diagram illustrating an embodiment of an electronic system including a semiconductor device manufactured according to embodiments.

Referring to FIG. 5, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include the semiconductor device manufactured according to embodiments.

The controller 1110 may include at least one of a microprocessor, a digital signal processor, a microcontroller, or other logic devices capable of performing a similar function to any one thereof The I/O unit 1120 may include a keypad, a keyboard, and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

Figure 6:
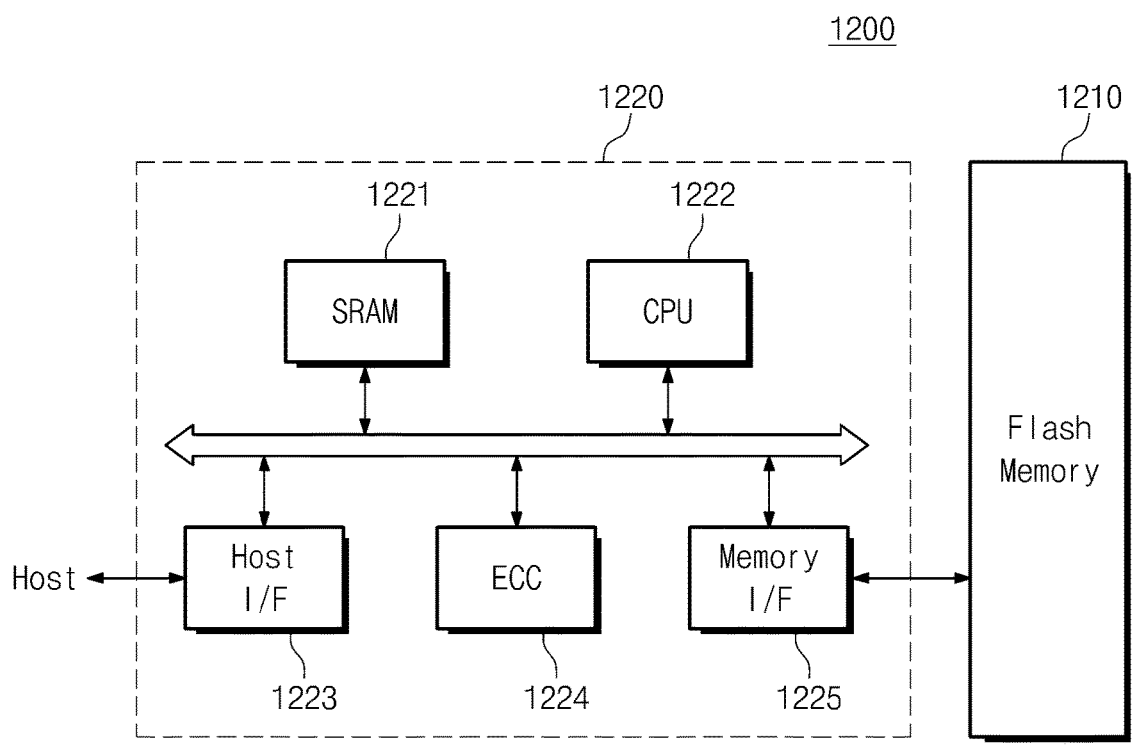
FIG. 6 is a schematic block diagram illustrating an embodiment of a memory card including a semiconductor device manufactured according to embodiments.

FIG. 6 is a schematic block diagram illustrating an embodiment of a memory card including a semiconductor device manufactured according to embodiments.

Referring to FIG. 6, a memory card 1200 for storing massive data may include a flash memory device 1210 including the semiconductor device manufactured according to embodiments. The memory card 1200 may include a memory controller 1220 that controls data communication between a host and the flash memory device 1210.

An SRAM device 1221 may be used as an operation memory of a central processing unit (CPU) 1222. A host interface unit 1223 may be configured to include a data communication protocol between the memory card 1200 and the host. An error check and correction (ECC) block 1224 may detect and correct errors of data which are read out from the multi-bit flash memory device 1210. A memory interface unit 1225 may interface with the memory device 1210 including the semiconductor device manufactured according to embodiments. The CPU 1222 may perform overall control operations of the memory controller 1220. Even though not shown in the drawings, the memory card 1200 may further include a read only memory (ROM) device that stores code data to interface with the host.

According to embodiments, since the photoresist composition includes the OOB absorbing material absorbing light of the wavelength of 100 nm to 300 nm, it is possible to improve the resolution of a photoresist pattern. In addition, the OOB absorbing material may be dissolved in the development solution so as to be removed, and thus, an additional process of removing the OOB absorbing material may not be performed.

While the concepts have been described with reference to example embodiments, it will be apparent to those skilled in the art that various changes and modifications may be made without departing from the spirit and scope of the disclosure. Therefore, it should be understood that the above embodiments are not limiting, but illustrative. Thus, the scope of the disclosed concepts are to be determined by the broadest permissible interpretation of the following claims and their equivalents, and shall not be restricted or limited by the foregoing description.

What is claimed is:

1. A method of forming a photoresist pattern, the method comprising:

applying a photoresist composition to a top surface of a substrate to form a photoresist layer, wherein the photoresist layer comprises a lower photoresist layer and an upper photoresist layer;

exposing the photoresist layer using a first light and a second light; and performing a development process on the photoresist layer by selectively removing the upper photoresist layer with a water-soluble alkaline development solution, wherein the lower photoresist layer remains to form a photoresist pattern on the substrate, wherein the photoresist composition comprises: a photoresist resin of 1 wt % to 10 wt %; a photo acid generator of 0.1 wt % to 3 wt %; an out-of-band (OOB) absorbing material of 0.1 wt % to 3 wt %; and a solvent, wherein the OOB absorbing material becomes separated from a phase of the other ingredients of the photoresist composition and forms the upper photoresist layer by self-assembly, wherein the OOB absorbing material is soluble in the water-soluble alkaline development solution and is selectively removed in the development process by the-water-soluble alkaline development solution, wherein the first light has a wavelength of about 100 nm to 300 nm and is absorbed by the upper photoresist layer, wherein the second light has a wavelength of an extreme ultraviolet (EUV), wherein the second light penetrates the upper photoresist layer and exposes the lower photoresist layer, wherein the OOB absorbing material comprises a first material including at least one of materials expressed by the following chemical formulas 4 to 6:

[Chemical formula 4]

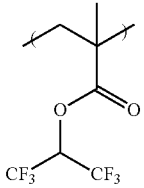

[Chemical formula 5]

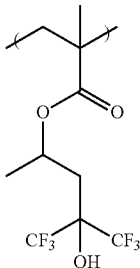

[Chemical formula 6]

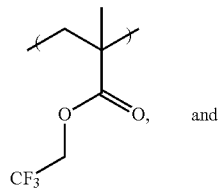

and wherein the OOB absorbing material comprises a second material including at least one of materials expressed by the following chemical formula 7 and 9:

[Chemical formula 7]

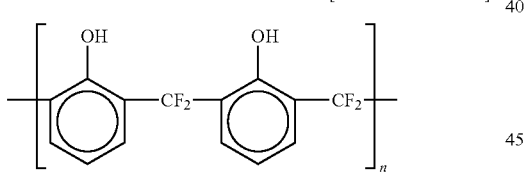

[Chemical formula 9]

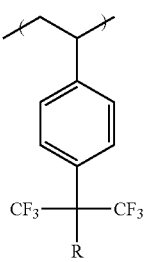

wherein "n" denotes an integer equal to or greater than 1, and "R" denotes a chain, branched or cyclic hydrocarbon group, or alcohol group having a carbon number of 1 to 10.

2. The method of claim 1,
wherein the photoresist pattern includes a plurality of holes,
wherein each of the plurality of holes has a diameter of 40 nm or less, and
wherein a distance between adjacent holes of the plurality of holes is 40 nm or less.

3. The method of claim 1,
wherein the photoresist pattern includes line patterns that are parallel to each other and spaced apart from each other,
wherein each of the line patterns has a width of 40 nm or less, and
wherein a distance between the line patterns adjacent to each other is 40 nm or less.

4. The method of claim 1,
wherein the water-soluble alkaline development solution used in the development process includes tetramethylammonium hydroxide (TMAH), and
wherein the OOB absorbing material is dissolved in the water-soluble alkaline development solution so as to be removed during the development process.

5. The method of claim 1, wherein the OOB absorbing material comprises:
the second material absorbing light having a wavelength of 100 nm to 300 nm.

6. The method of claim 5,
wherein a content of the first material ranges from 20 wt % to 40 wt % in the OOB absorbing material, and
wherein a content of the second material ranges from 60 wt % to 80 wt % in the OOB absorbing material.

7. A method of forming a photoresist pattern, the method comprising:
applying a photoresist composition to a top surface of a substrate to form a photoresist layer, wherein the photoresist layer comprises a lower photoresist layer and an upper photoresist layer;
exposing the photoresist layer using a first light and a second light; and
performing a development process on the photoresist layer by selectively removing the upper photoresist layer with a water-soluble alkaline development solution, wherein the lower photoresist layer remains to form a photoresist pattern on the substrate,
wherein the photoresist composition comprises: a photoresist resin of 1 wt % to 10 wt %; a photo acid generator of 0.1 wt % to 3 wt %; an out-of-band (OOB) absorbing material of 0.1 wt % to 3 wt %; and a solvent,
wherein the OOB absorbing material becomes separated from a phase of the other ingredients of the photoresist composition and forms the upper photoresist layer by self-assembly,
wherein the OOB absorbing material is soluble in the water-soluble alkaline development solution and is selectively removed in the development process by the water-soluble alkaline development solution,
wherein the first light has a wavelength of about 100 nm to 300 nm and is absorbed by the upper photoresist layer,
wherein the second light has a wavelength of an extreme ultraviolet (EUV),
wherein the second light penetrates the upper photoresist layer and exposes the lower photoresist layer,
wherein the OOB absorbing material comprises a first material including fluorine (F), and
wherein the OOB absorbing material comprises a second material including at least one of materials expressed by the following chemical formulas 7 and 9,

[Chemical formula 7]

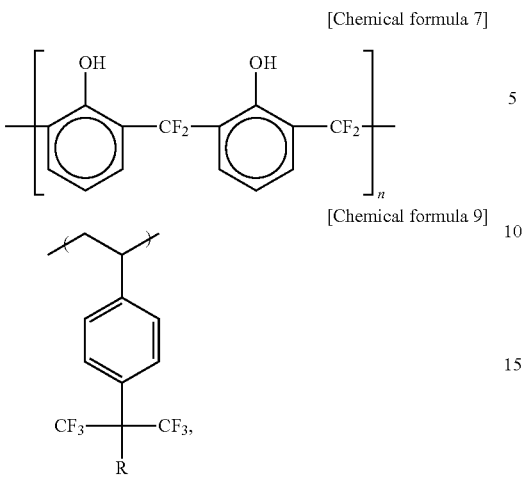

[Chemical formula 9]

wherein "n" denotes an integer equal to or greater than 1, and "R" denotes a chain, branched or cyclic hydrocarbon group, or alcohol group having a carbon number of 1 to 10.

8. The method of claim 7, wherein the first material includes at least one of materials expressed by the following chemical formula 1:

[Chemical formula 1]

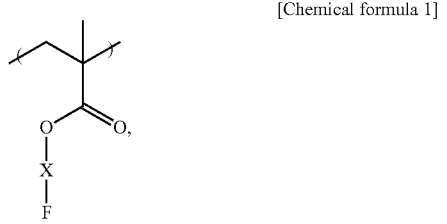

wherein X denotes a chain, branched or cyclic hydrocarbon group, or alcohol group having a carbon number of 1 to 10.

9. The method of claim 7, wherein the photoresist pattern includes a plurality of holes, wherein each of the plurality of holes has a diameter of 40 nm or less, and wherein a distance between adjacent holes of the plurality of holes is 40 nm or less.

10. The method of claim 7, wherein the photoresist pattern includes line patterns that are parallel to each other and spaced apart from each other, wherein each of the line patterns has a width of 40 nm or less, and wherein a distance between the line patterns adjacent to each other is 40 nm or less.

11. The method of claim 7, wherein a content of the first material ranges from 20 wt % to 40 wt % in the OOB absorbing material, and wherein a content of the second material ranges from 60 wt % to 80 wt % in the OOB absorbing material.

12. The method of claim 7, wherein the water-soluble alkaline development solution used in the development process includes tetramethylammonium hydroxide (TMAH), and wherein the OOB absorbing material is dissolved in the water-soluble alkaline development solution so as to be removed during the development process.

* * * * *